(12) United States Patent
Azcarate et al.

(10) Patent No.: US 7,488,636 B2
(45) Date of Patent: Feb. 10, 2009

(54) BROKEN DIE DETECT SENSOR

(75) Inventors: Ronald B. Azcarate, Baguio (PH);
Alwin A. Rosete, Baguio (PH); Jong A. Foronda, Jr., Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 362 days.

(21) Appl. No.: 11/254,131

(22) Filed: Oct. 20, 2005

(65) Prior Publication Data

US 2006/0033186 A1    Feb. 16, 2006

Related U.S. Application Data

(62) Division of application No. 09/952,954, filed on Sep. 13, 2001, now Pat. No. 7,051,427.

(60) Provisional application No. 60/236,521, filed on Sep. 29, 2000.

(51) Int. Cl.
*H01L 21/8238* (2006.01)
(52) U.S. Cl. .................................................... 438/200
(58) Field of Classification Search .............. 438/15, 438/25, 26, 55, 64, 106, 107, 109, 110, 128; 257/686, 737, 738, 778; 361/735, 736, 790, 361/749, 767
See application file for complete search history.

(56) References Cited

U.S. PATENT DOCUMENTS

| | | | | |
|---|---|---|---|---|
| 4,564,251 A | * | 1/1986 | Hansen et al. | ................. 439/71 |
| 5,054,188 A | | 10/1991 | Sabado | ....................... 29/564.6 |
| 5,440,231 A | | 8/1995 | Sugai | ....................... 324/158.1 |
| 5,714,792 A | | 2/1998 | Przano | ........................ 257/670 |
| 5,767,480 A | | 6/1998 | Anglin et al. | ........... 219/121.69 |
| 5,773,878 A | | 6/1998 | Lim et al. | .................... 257/676 |
| 5,911,112 A | | 6/1999 | Kirkman | ..................... 438/612 |
| 5,979,277 A | | 11/1999 | Kitsuda et al. | .................. 83/13 |
| 6,065,381 A | * | 5/2000 | Kim et al. | ....................... 83/98 |
| 6,069,025 A | | 5/2000 | Kim | ........................... 438/109 |
| 6,137,299 A | * | 10/2000 | Cadieux et al. | ............. 324/757 |
| 2003/0013249 A1 | * | 1/2003 | Honma et al. | ............... 438/200 |

* cited by examiner

*Primary Examiner*—Charles D. Garber
*Assistant Examiner*—Andre' C Stevenson
(74) *Attorney, Agent, or Firm*—Wade J. Brady, III; Frederick J. Telecky, Jr.

(57) ABSTRACT

A broken trim die tool detection sensor. The lands of the tie bar die connect with the leads of the unit to form switches. The states of these switches indicate broken die lands or other malfunctions.

7 Claims, 3 Drawing Sheets

BROKEN DIE DETECT SENSOR

This application is a division of Ser. No. 09/952,954, filed Sep. 13, 2001, now U.S. Pat. No. 7,051,427, which claims priority under 35 U.S.C. §119(e) from Provisional Application Ser. No. 60/236,521, filed Sep. 29, 2000.

BACKGROUND AND SUMMARY OF THE INVENTION

The present invention relates to integrated circuit structures and fabrication methods. In particular, the present application describes an improvement to back end processing.

BACKGROUND

Part of the semiconductor device manufacturing process is packaging of the device. Packaging is necessary to protect a device from breakage, infiltration by dirt and debris, and to protect the device from atmospheric changes such as humidity which can affect device performance. Particulate contaminates can eventually penetrate the passivation layer of a chip and interfere with the functioning of a device. Particulates may also carry chemicals that can react with metallic interconnects. Penetration of the package by moisture is also an important concern, since moisture often causes subsequent degradation of the device. Packaging also gives some robustness to microelectronic devices, making them easier to work with and place on printed circuit boards.

Plastics, ceramics, and glass are commonly used materials for packaging devices, though plastic is becoming the predominant material. In plastic encapsulation, the package material (usually a thermoset polymer with some inert material and other ingredients) is transferred to a mold cavity which holds the chips bonded to leadframes. Leadframes are metal frames that include the leads of a circuit package. The unit is placed in a central receiving area, and bond pads on the unit are electrically connected to bond fingers on the lead frame, which extend to become the external connections to the chip itself. These external connections are called leads.

Packaging steps typically include mounting the semiconductor devices to a leadframe, forming wire bonds between the leadframe and the devices, followed by encapsulation of the devices within a packaging material. The devices are then trimmed of excess plastic or "flash" material that remains after encapsulation, and material from between the leads is removed. The material connecting the leads before separation is often called a tie bar or dambar. The leads are then cut to proper length, and bent to a desired configuration.

Normal trimming and cutting tools are usually of a comb shape, with many fingers extending toward the chip carriage to remove the excess material from between leads. A typical trim die tool set includes a tie bar punch and a tie bar die. A unit is placed between a tie bar punch and a tie bar die within the trim die tool set. When the punch and the die are moved together, the fingers of the punch fit between the fingers or lands of the die to remove any material between them. This has the effect of removing tie bars from the metal leads on the unit.

Since several chips are typically run in a lot, damage to one of the teeth or lands of the tie bar punch or the tie bar die can result in improper trimming or connections for all chips in a batch after the damage occurred.

Typical solutions require manual visual inspection of processed units to detect breaks. This method cannot detect broken units until after the batch is run, so that if the lower trim die itself breaks, several improperly processed units will result, requiring a large part of that batch to be scrapped.

Other solutions install systems that visually check each processed wafer as they exit the process, allowing stoppage at the first sign of a broken lower trim die, but this method cannot detect breakages if the leads are not yet detached from the package, but is already malformed. There is therefore a need in the art for a method of detecting broken trim die tools that detects errors in real time and reliably detects breaks in the trim die tool.

Broken Die Detect Sensor

The present application discloses an innovative means to detect a broken trim die tool. In the preferred embodiment, the lands of the tie bar die are electrically connect with the leads of the unit in the tool. The connection between each lead and each land forms a switch. These switches are used to detect whether the connection is made properly on all lands in each unit. An improper connection (caused by misalignment, a broken trim die tool, or any other problem) causes the switch to be open. This switch is used in a detection circuit to monitor that all lands and leads are properly connected during the trimming process. If a switch is open, indicating a disconnect, packaging can be stopped and the tool repaired with a minimization of downtime or scrapped units.

Advantages of the disclosed methods and structures, in various embodiments, can include one or more of the following:

detects breakages of trim die tool in real time;
reduction in scrappage;
minimal loss of throughput.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
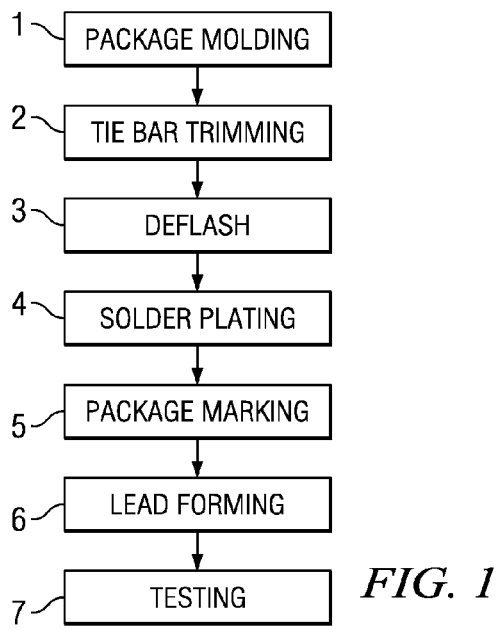
FIG. 1 shows a flow chart of the back end manufacturing process flow incorporating the preferred embodiment.

The preferred embodiment is described with reference to the drawings. FIG. 1 shows a flow chart of part of the back end process flow for integrated circuits. First, package molding is performed (Step 1) followed by tie bar trimming (Step 2)

(removal of metal connections between the different leads extending from the chip). Next is deflash (Step 3), where the excess plastic mold material that remains after encapsulation is removed. These steps are followed by solder plating (Step 4), package marking (Step 5), lead forming (Step 6), and testing of the packaged chip (Step 7).

Figures 2A, 2B:
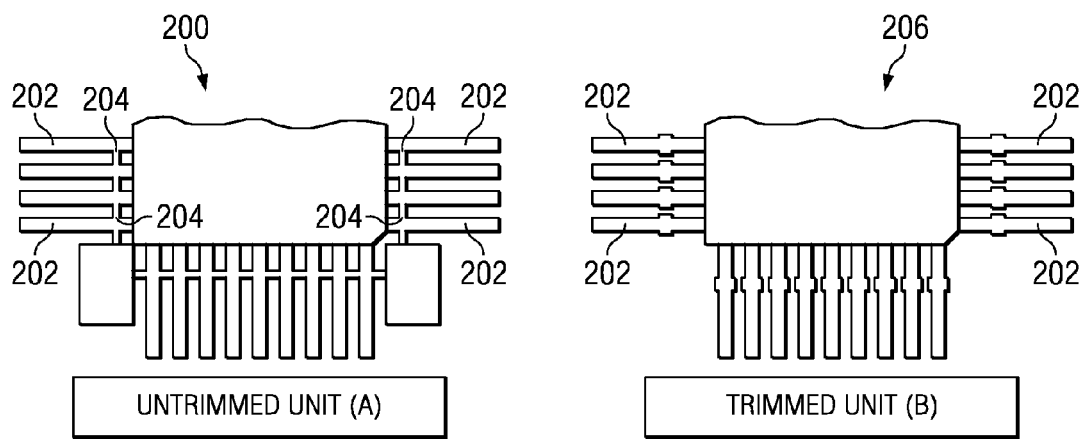
FIG. 2a shows an untrimmed unit.
FIG. 2b shows a trimmed unit.

The presently preferred embodiment relates to improvements to step 2 of FIG. 1, where the excess metal connecting the metal leads, also called tie bars or dambar, is removed. FIG. 2a shows an untrimmed unit 200. The unit 200 has leads 202 extending from the chip. Immediately after package molding, the leads 202 are still connected to both the chip itself and to one another by connecting pieces of metal 204. These pieces of metal 204 (the tie bars) must be removed from the unit 200, leaving a trimmed unit 206 as shown in FIG. 2b. Note that the metal leads 202 extending from the chip are now separated from one another.

Figures 3A, 3B:
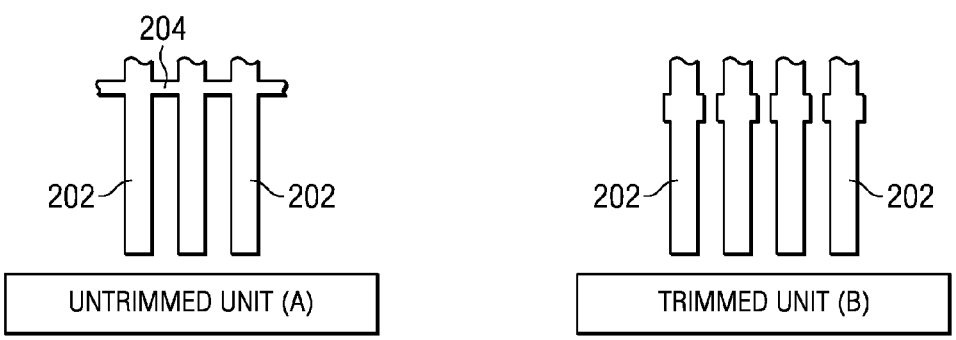
FIG. 3a shows a detail of an untrimmed unit.
FIG. 3b shows a detail of a trimmed unit.

FIGS. 3a and 3b show details of an untrimmed unit (FIG. 3a) and a trimmed unit (FIG. 3b). As seen in FIG. 3a, the untrimmed unit still has the tie bar 204 connecting the leads 202 at a position very close to the chip itself. The trimmed unit in FIG. 3b shows the tie bars removed, leaving the leads 202 clean and separated from one another.

Figure 4:
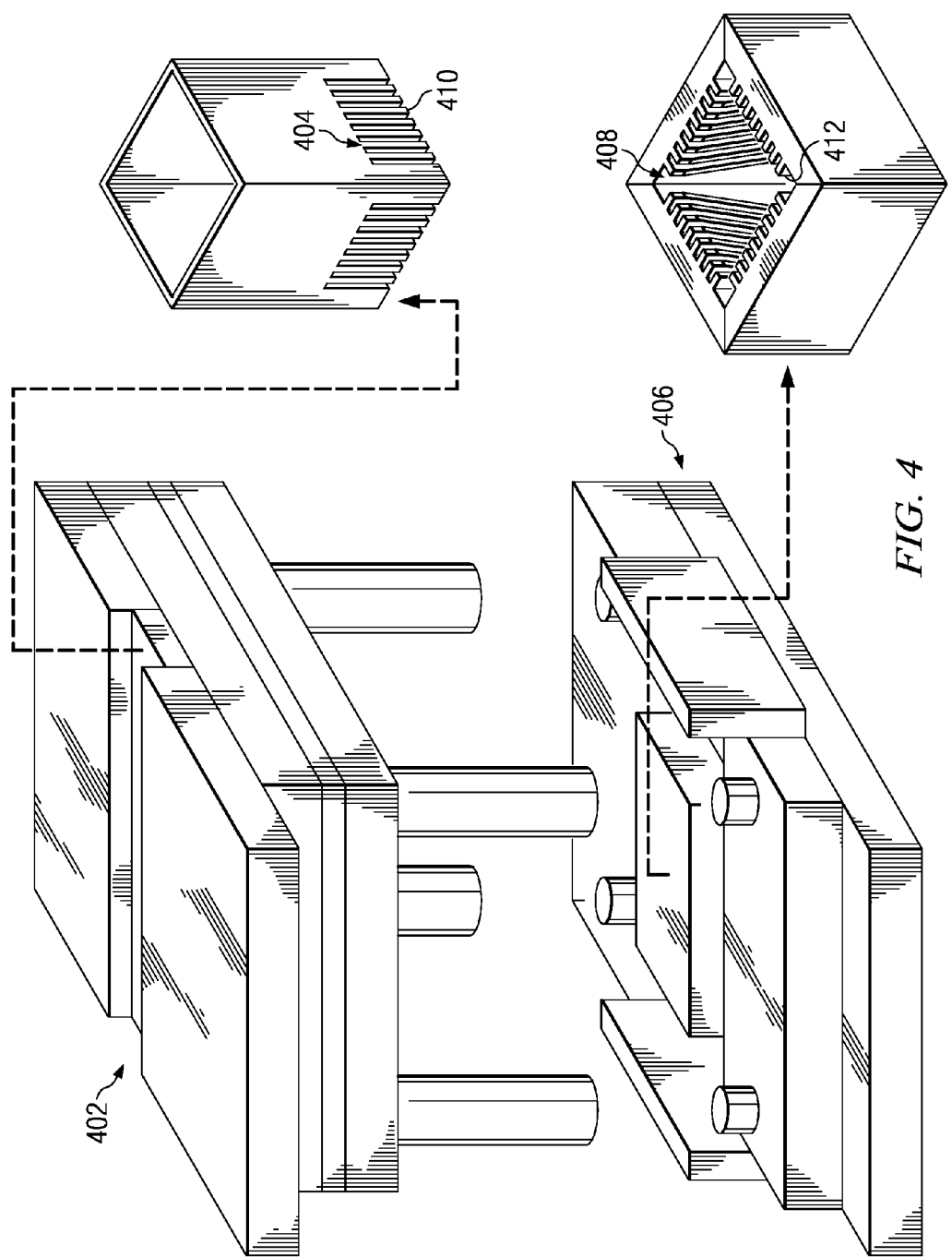
FIG. 4 shows a trim die tool set that incorporates the preferred embodiment.

The removal of the tie bars is accomplished with a special tool called a trim die tool set. FIG. 4 shows a trim die tool set, along with detailed individual parts of the trim die tool set. The set comprises an upper trim die 402 which includes a tie bar punch 404, and a lower trim die 406 which includes a tie bar die 408. The tie bar punch 404 refers to the part of the upper trim die 402 used to push the tie bar against the lower trim die 406. The tie bar die 408 refers to the part of the lower trim die 406 used to remove the tie bar.

The tie bar punch 404 comprises several teeth 410 spaced according to the dimensions of the leads, so that when the punch 404 is positioned above the unit, the teeth 410 of the punch 404 will be located above the tie bars that connect the leads. The tie bar die 408 has corresponding teeth or lands 412 that fit between the teeth 410 of the tie bar punch 404, so that when the tie bar punch 404 and the tie bar die 408 are pressed together, the teeth 410 of the punch 404 interdigitate with the lands 412 of the die 408.

During trimming with the trim die tool set, the chip has leads attached, but the leads are untrimmed with tie bars still connecting each lead to its nearest neighbors. The chip is placed in the trim die tool set and the tie bar punch is lowered against the tie bar die. The chip leads are between the punch and the die, and the punches lower directly into contact with the tie bars but not the leads themselves. The leads make contact with the die lands. As the punch is lowered it trims the tie bars from the leads.

Figure 5:
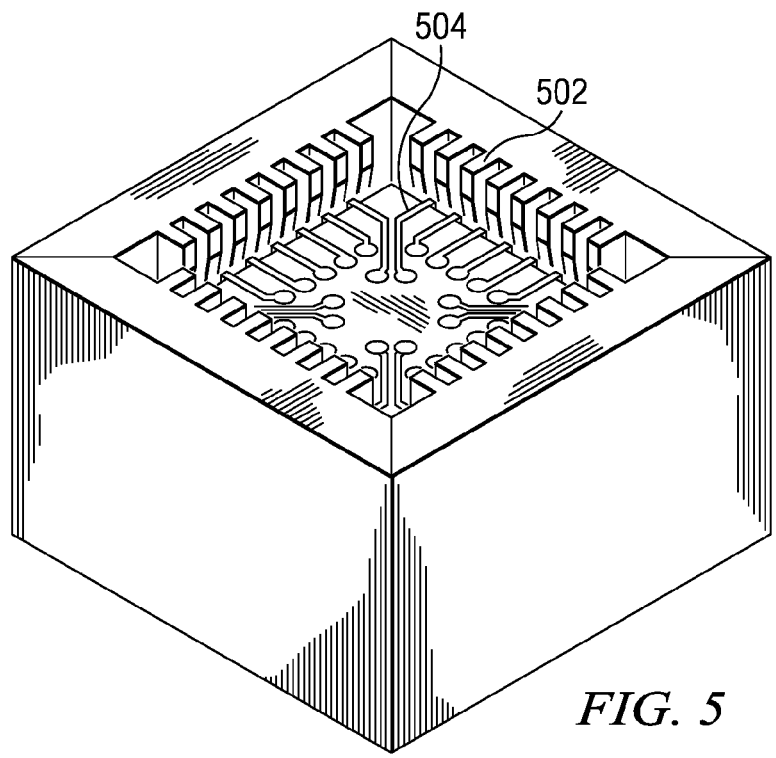
FIG. 5 shows a close-up of the trim bar die with a unit therein.

FIG. 5 shows closeup of the trim bar die with a unit therein. The lands 502 make contact with the leads 504 of the unit. The present innovations take advantage of this contact to improve broken die detection in the lead trimming process.

The present innovations use the principle of a latching circuit to detect broken die lands. The parts of the trim die tool itself along with the metal leads of the unit are used to form a switch in a latching circuit so that when the metal connection between the leads 504 and the lands 502 is broken a sensor is alerted. Thus, if an individual land 502 breaks, the switch (formed by the connection of the land 502 and the lead 504) will be open because of a loss of contact between the land 502 and the lead 504. The loss of contact will cause the voltage at a detection node to be at a different voltage than if the switch were closed.

Figure 6:
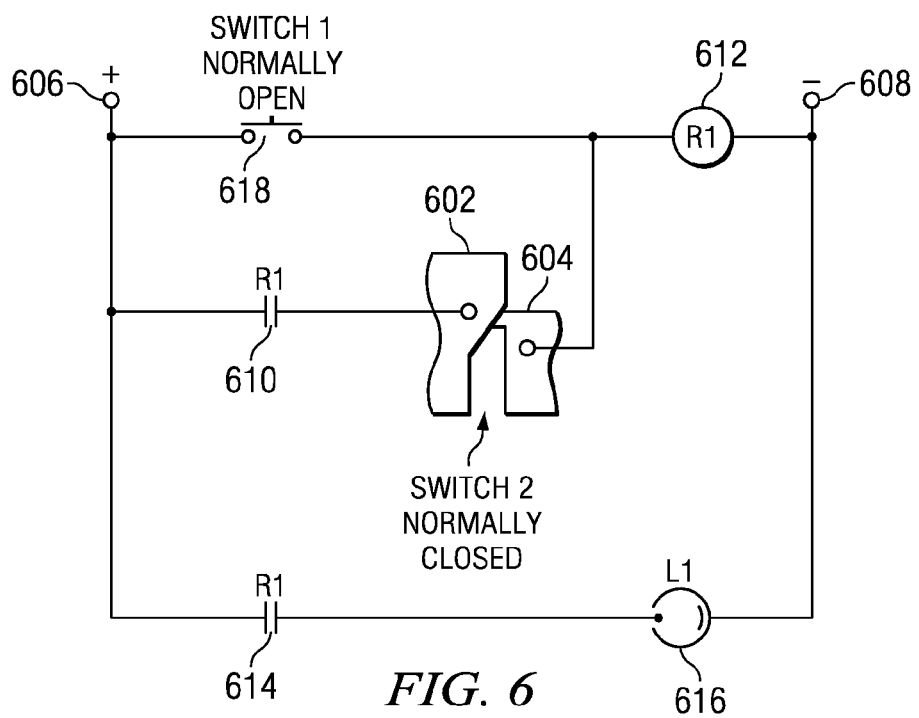
FIG. 6 shows a preferred embodiment of the detection switch.

FIG. 6 shows a preferred embodiment for the detection switch. The switch itself is created by contact between the die land 602 and the individual lead 604 that contacts it. A positive node 606 is connected to a negative node 608 through two parallel circuit connections. The first connection contains a resistor of value r1 610, the switch (formed by the contact between a die land 602 and a unit lead 604), and another resistor R1 612. The second parallel connection between the two nodes 606, 608 comprises another resistor 614 of the same value r1 and a light 616 (or other load element) L1. In the preferred embodiment, L1 and R1 are designed to have the same resistance. When the die land 602 is in proper contact with the unit lead 604, the switch remains closed. In the event that the die land 602 brakes, there will no longer be contact between the die land 602 and the lead 604, causing the switch to be open.

When the switch is closed, meaning that the land 602 and the lead 604 are making a proper connection and that the die land 602 is not broken, the current through the light L1 616 is the same as the current through the resistor R1 612. When the switch is open, indicating a non-connection between the land 602 and the lead 604, the current through L1 is roughly doubled. This change in operation of the light L1 is used as a broken die detection sensor, though it could be implemented in other ways. In the preferred embodiment, when the light is at a first brightness, this corresponds to a first current level through the light, which in turn corresponds to a closed switch position. When the light is at a second brightness, this indicates a second different current through the light, indicating a different switch state-open, meaning that the die land and the lead are not making proper contact. The detection circuitry can be bypassed by closing switch 618 in the circuit.

The present innovations increase productivity in back end processing by detecting broken die lands (or other problems causing disconnection between the land and the lead). This detection is real-time, so that the process can be halted as soon as a broken land is detected. This prevents mass scrappage due to an undetected broken trim die, which would be used on succeeding units if not detected, causing these units to be improperly processed. Using the present innovative detection method, the system is able to stop at the instance of breakage, allowing an immediate fix and reducing downtime.

Definitions:

Following are short definitions of the usual meanings of some of the technical terms which are used in the present application. (However, those of ordinary skill will recognize whether the context requires a different meaning.) Additional definitions can be found in the standard technical dictionaries and journals.

Tie Bar: metal tie between leads.
Tie Bar Die: part of the lower trim die used to remove tie bar.
Tie Bar Punch: part of the upper trim die used to push the tie bar.
Tie Bar Trimming: removal of tie bars from a unit.
Trimmed Unit: the package after tie bar trimming.
Trim Die: metal tool set used in tie bar trimming.
Upper and Lower Trim Die: two parts of the trim die tool set.
Untrimmed Unit: the package after package molding.
Unit: refers to the package.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

The circuit used to detect the connection between the lands and the leads can obviously be of many varying configurations and still benefit from the innovations of the present application. For example, the switch could be part of a flip-flop or a latching circuit, or any other device where a voltage state that depends on the switch state can be monitored.

Additional general background, which help to show the knowledge of those skilled in the art regarding variations and implementations of the disclosed inventions, may be found in the following documents, all of which are hereby incorporated by reference:

CHIP SCALE PACKAGING by Lau and Lee, McGraw Hill (1999);
HANDBOOK OF ELETRONIC PACKAGING by Harper, McGraw Hill (1969).

What is claimed is:

1. A method for trimming a unit, comprising the steps of:
   placing said unit in a trimming device, said unit having a plurality of leads;
   forming an electrical connection between at least one of said leads and part of said device; and
   indicating when said connection is broken while said unit is within said trimming device.

2. The integrated circuit of claim 1, wherein said connection is made between each of said leads and individual lands of said trimming device.

3. The integrated circuit of claim 1, wherein said connection forms a switch that is part of a latching circuit.

4. A method for trimming a unit, comprising the steps of:
   placing part of said unit in electrical contact with part of a trimming device;
   indicating when said contact is broken during the trimming process while said unit is in electrical contact with said cart of said trimming device.

5. The integrated circuit of claim 4, wherein said contact is used as a closed switch, and when said contact is broken said switch is open.

6. The integrated circuit of claim 4, wherein said contact is between at least one lead of said unit and at least one land of said device.

7. The integrated circuit of claim 4, wherein said contact is made multiple times, once between each lead of said unit and each land of said unit.

* * * * *